United States Patent [19]

Cohen

[11] Patent Number: 4,701,843
[45] Date of Patent: Oct. 20, 1987

[54] REFRESH SYSTEM FOR A PAGE ADDRESSABLE MEMORY

[75] Inventor: Morris Cohen, San Diego, Calif.

[73] Assignee: NCR Corporation, Dayton, Ohio

[21] Appl. No.: 718,764

[22] Filed: Apr. 1, 1985

[51] Int. Cl.[4] .............................................. G06F 12/16
[52] U.S. Cl. ..................................... 364/200; 365/222
[58] Field of Search ... 364/200 MS File, 900 MS File; 365/222, 235

[56] References Cited

U.S. PATENT DOCUMENTS

| | | | |
|---|---|---|---|
| 3,846,765 | 11/1974 | De Vries | 365/222 X |
| 4,106,108 | 8/1978 | Cislaghi et al. | 365/222 |
| 4,172,282 | 10/1979 | Aichelmann et al. | 364/200 |
| 4,238,842 | 12/1980 | Aichelmann | 365/222 |
| 4,328,566 | 5/1982 | Thaler | 365/222 |

FOREIGN PATENT DOCUMENTS 2095442 9/1982 United Kingdom ............... 365/222

Primary Examiner—Raulfe B. Zache
Assistant Examiner—Florin Munteanu
Attorney, Agent, or Firm—Wilbert Hawk, Jr.; Edward Dugas; Floyd A. Gonzalez

[57] ABSTRACT

A computer memory including a memory subsystem controller having a circuit for providing a plurality of block select signals and a raw address. A plurality of memory blocks is provided, with one of the memory blocks being provided for each of the block select signals from the memory subsystem controller. Each of the memory blocks includes random access memory (RAM) devices for storing data, and a refresh circuit for refreshing its associated RAM devices independent of the refreshing of the RAM devices of the other blocks. The refreshing of the refresh circuit occurs, if possible, when its associated memory block is not selected by its corresponding block select signal from the memory subsystem controller. A re-establishing circuit is included in each memory block which receives a row address from the memory subsystem controller and re-establishes the received row address in its RAM devices after they have been refreshed.

11 Claims, 14 Drawing Figures

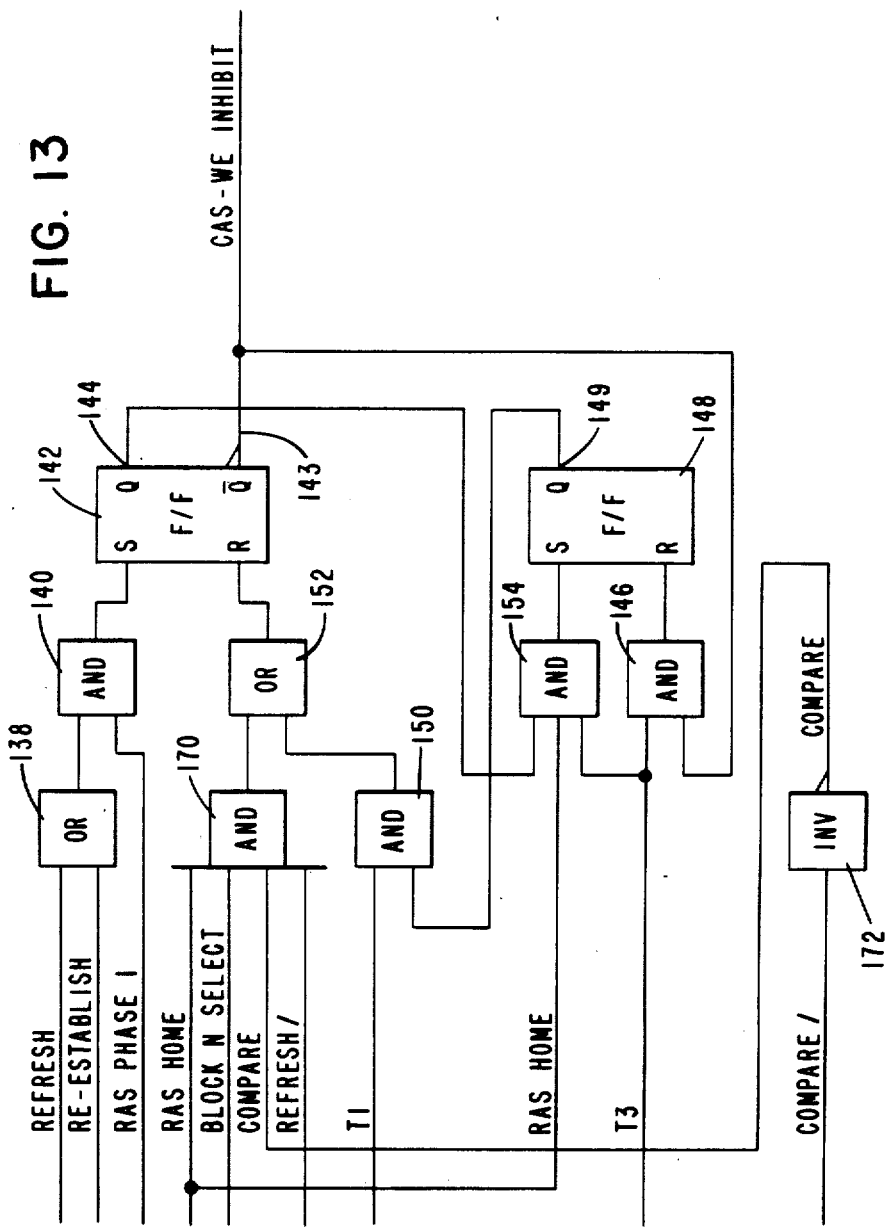

REFRESH SYSTEM FOR A PAGE ADDRESSABLE MEMORY

BACKGROUND OF THE INVENTION

The present invention relates to memory devices usable in data processing systems, and more particularly to an apparatus for enhancing the operation of random access memory (RAM) devices.

Data processing systems having a main memory made up of a plurality of RAM memory devices arranged into blocks are known. Each block is selected by select lines such that only the block of interest is selected during a memory operation.

Also known are memory refresh schemes in which the memory row of the RAM devices is refreshed with each memory read, with each memory access, and automatically at the end of a set period of time. Many RAM devices require external means for generating and multiplexing row addresses for refreshing. Some RAM devices incorporate a row address counter and a multiplexer for refreshing, but require an external refresh timing signal. Refresh counters which generate the row address to be refreshed during each time interval are also known.

RAM devices which operate in a "page mode" in which sequential accesses to the device may be made in the same row are also known. In the page mode operation, the original row address strobed into the device at the beginning of the page mode operation is held in the device and only new column addresses are strobed into the device, allowing for faster operation.

U.S. Patents of interest are: 4,292,676 issued Sept. 29, 1981 to Heniz; 4,296,480 issued Oct. 20, 1981 to Eaton, Jr. et al.; 4,328,566 issued May 4, 1982 to Thaler; 4,333,167 issued Jan. 1, 1982 to McElroy; 4,347,589 issued Aug. 31, 1982 to Proebsting; 4,415,992 issued Nov. 15 1983 to Adlhock; and 4,486,860 issued Dec. 4, 1984 to Takemae et al.

SUMMARY OF THE INVENTION

In a specific embodiment, a computer memory is provided which includes means for providing a plurality of block select signals. A plurality of memory blocks is provided, with one of the memory blocks being provided for each of the block select signals from the memory subsystem controller. Each of the memory blocks includes random access memory (RAM) devices for storing data, and a refresh circuit for refreshing its associated RAM devices independent of the refreshing of the RAM devices of the other blocks. The refreshing of the refresh circuit occurs when its associated memory block is not selected by its corresponding block select signal from the memory subsystem controller.

The present invention is directed to an apparatus for enhancing the operation of memory subsystems consisting of blocks which incorporate RAM devices with page mode, Intel's Ripplemode, static column, or similar operating modes, all of which are referred to herein as a same row operating mode. The present invention includes a last row register associated with each block for storing the address of the last row strobed into the RAM devices of that block. It also includes a comparison circuit associated with each block which compares the row address for a current memory operation with the address in the last row register, and the result of the comparison associated with the selected block determines whether a long cycle or a short cycle is required for the current memory cycle.

The disclosed apparatus also includes a refresh circuit which enhances the operation of memory subsystems consisting of blocks which include RAM devices that require refresh cycles. This refresh circuit refreshes all blocks that are not being used at the beginning of a refresh window of time and prevents blocks that are being used at the beginning of a refresh window of time from being refreshed until they are no longer being used. If, however, any blocks are continuously used throughout the refresh window, the memory operation is interrupted and these blocks are refreshed at that time so that no data is lost.

Since the likelihood is great that adjacent operations in a block will address the same row, and a refresh operation destroys the last row status in RAM devices with page mode, Intel's Ripplemode, static column, or similar operating modes, the disclosed apparatus includes a re-established circuit which re-establishes in the memory devices the last row whose address is in the last row register associated with that block. The re-established operation occurs immediately after the refresh operation, unless the block is selected before the end of the block's refresh operation. If the block is so selected, then a normal long cycle is taken, thereby strobing in the row that is addressed by the present operation. If a block is in a re-establishment operation and is selected before a critical time, then the apparatus converts the re-establishment operation into a normal long cycle.

It is thus a primary object of the present invention to provide an apparatus which enhances the operation of memory subsystems.

It is also an object of the present invention to provide an apparatus which refreshes blocks of memory when they are not otherwise being used.

It is also an object of the present invention to provide an apparatus which permits blocks of memory to operate in a short cycle if the present row address is the same as the last row address strobed into the selected block of memory.

It is also an object of the present invention to provide an apparatus which re-establishes the last row address in each block of memory after that block is refreshed.

It is also an object of the present invention to provide an apparatus which converts the re-establish operation into a memory operation if the block is selected while it is being refreshed or during the early part of the re-establishment operation.

BRIEF DESCRIPTION OF THE DRAWINGS

FIG. 13 is a CAS-WE INHIBIT signal control circuit of the block control circuit.

DESCRIPTION OF THE PREFERRED EMBODIMENT

Figure 1:
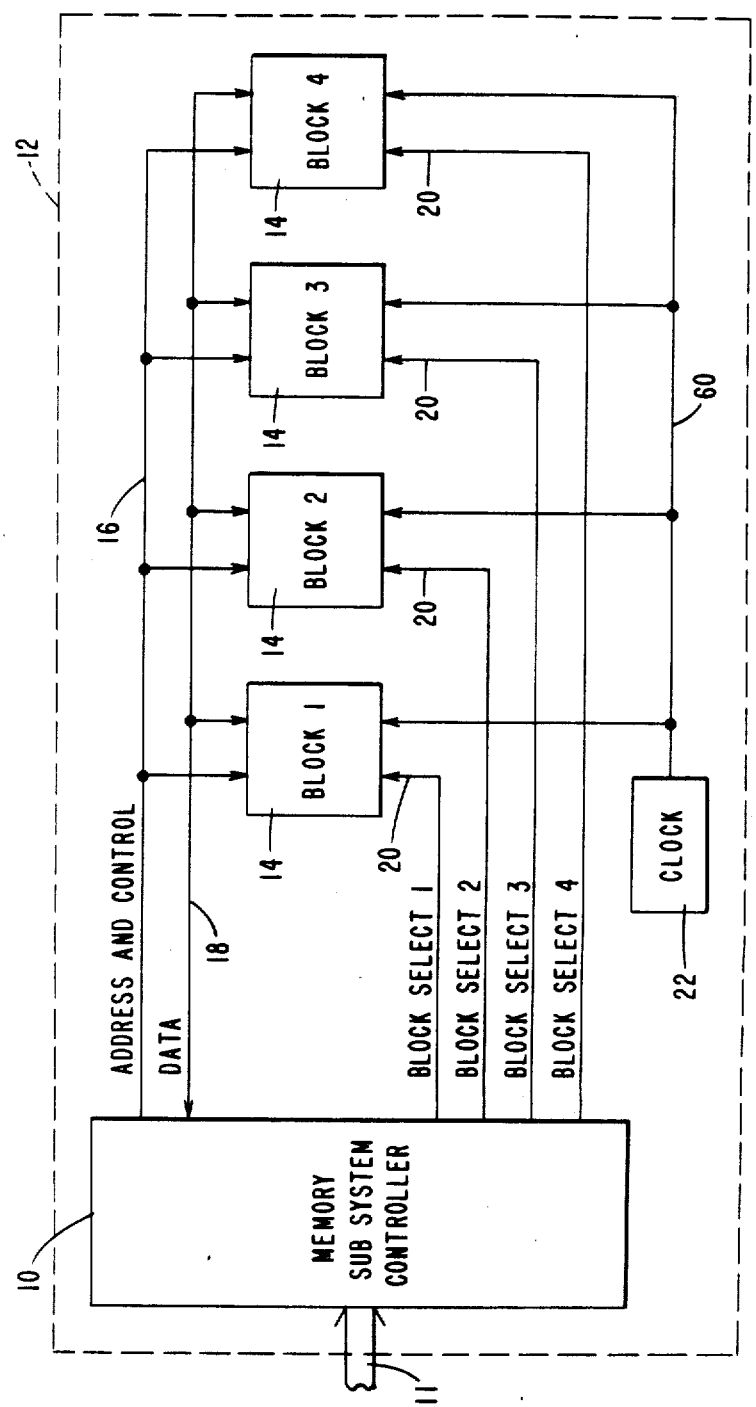
FIG. 1 discloses a block diagram of a data processing system of the present invention.

FIG. 1 is a block diagram of a data processing system of the present invention having a memory 12 which includes a memory subsystem controller 10 and a plurality of blocks 14. A memory bus 11 provides the means for connecting the memory 12 to a processor, I/O controller, or other unit that can initiate a memory operation. An address and control bus 16 is connected between the memory subsystem controller 10 and each of the memory blocks 14 for transmitting address and control signals for controlling memory operations. A data bus 18 is also connected between the memory subsystem controller 10 and each of the memory blocks 14 for transmitting data as specified by the address and control signals.

As mentioned, the memory 12 is divided into convenient sized blocks 14 (shown in FIG. 1 as four blocks designated BLOCK 1–BLOCK 4. Each block 14 has its own block select line 20 between each individual block 14 and the memory subsystem controller 10. When a memory operation such as a read or write is to occur, the memory subsystem controller 10 places the proper address and control signals on bus 16 to all of the blocks 14, and the desired block is selected by activating the appropriate block select line 20.

Among the advantages of this configuration, is the fact that only the memory block actually needed for a desired memory operation is active, while the rest are idle. If the memory blocks 14 are made up of volatile memory elements which must be periodically refreshed, the refresh operations may be conducted on those memory blocks 14 which are idle without affect on the data processing system. A free running clock 22 is provided, and is connected to each memory block 14 by a time bus 60 for providing time pulses to each memory block 14, as will be explained.

Figure 2:
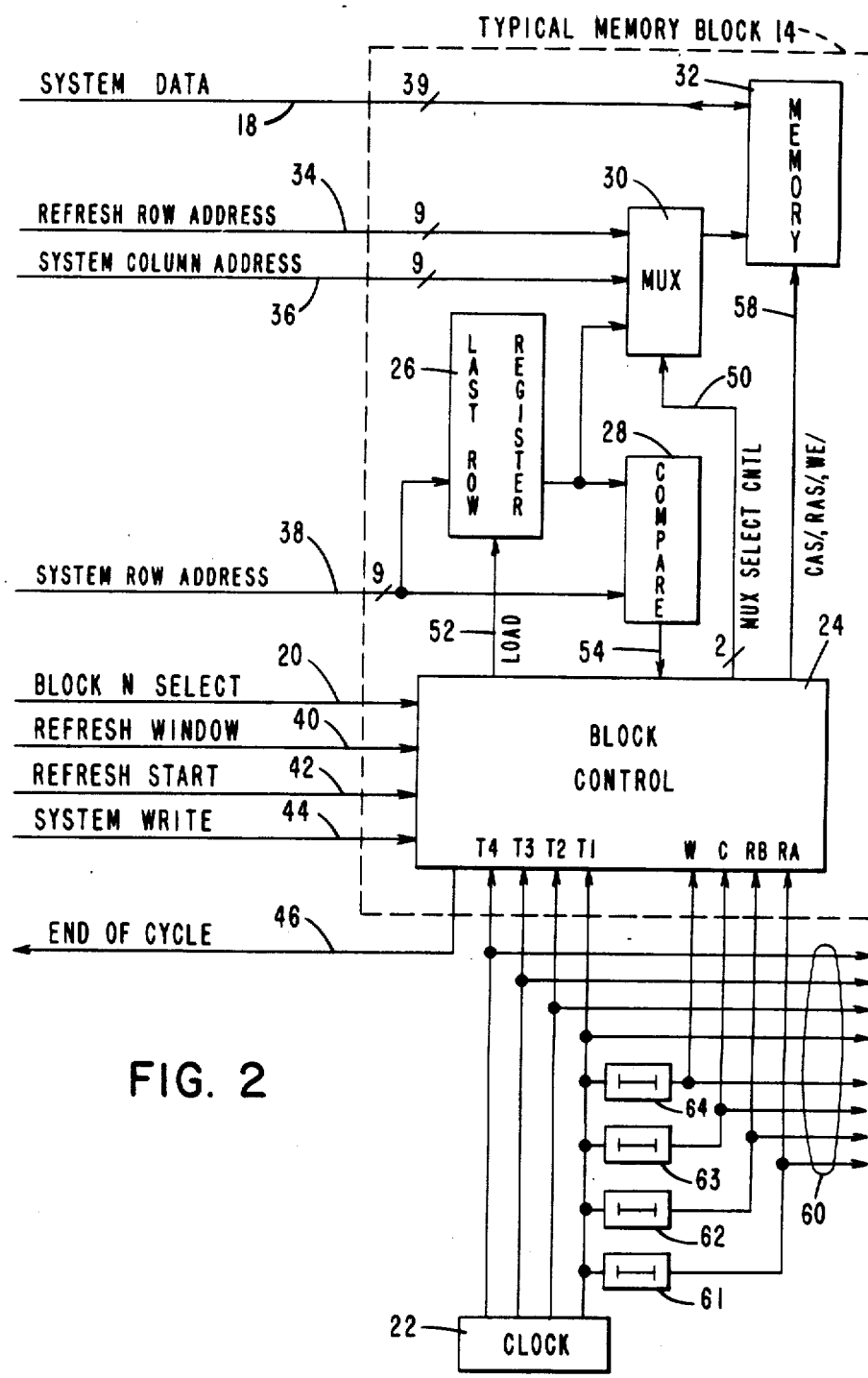
FIG. 2 is a block diagram of a memory block of FIG. 1.

FIG. 2 is a block diagram of one of the memory blocks 14 shown in FIG. 1 along with the clock 22 of FIG. 1. Each memory block 14 includes a block control circuit 24, whose elements will be discussed later, a last row register 26, a compare circuit 28, a multiplexer 30 designated MUX, and a plurality of memory integrated circuit chips 32. A refresh row address bus 34, a system column address bus 36, a system row address bus 38, a refresh window conductor 40, a refresh start conductor 42, a system write conductor 44, and an end of cycle conductor 46, all included in the address and control bus 16 of FIG. 1, are connected as shown to the memory block 14. The block select conductor 20 of FIG. 1, designated in FIG. 2 as BLOCK N SELECT, is provided for the particular memory block 14 of FIG. 2.

The data bus 18 of FIG. 1 is a multi-conductor data bus designated SYSTEM DATA in FIG. 2.

The multiplexer 30 multiplexes addresses from the refresh row address bus 34, the system column address bus 36, or the last row register 26 dependent upon multiplexer select control signals transmitted over the control bus 50 from the block control circuit 24, as will be explained. A load conductor 52, from the block control circuit 24 to the last row register 26, controls loading the system row address from the bus 38 into the register 26. The compare circuit 28 compares the address on the system row address bus 38 with the address in the last row register 26, and outputs a COMPARE/ signal over conductor 54 to the block control circuit 24. The COMPARE/ signal is high when the addresses are not equal, and low when the addresses are equal.

Column address strobe (CAS/), row address strobe (RAS/) and write enable (WE/) signals are transmitted over a control bus 58 from the block control circuit 24 to the memory chips 32, as will be explained, to control the various memory operations of the chips 32. The various memory integrated circuit chips in 32 are arranged to supply or store all of the bits of, for instance, a word or an instruction stored in the chips 32 at the address supplied from address buses 36 and 38, as controlled by control signals from control bus 58, in a well-known fashion which will not be further explained herein.

The clock 22 outputs four non-overlapped time pulses T1–T4 over time bus 60 to each of the memory blocks 14. Time delay circuits 61, 62, 63 and 64 are connected to the T1 conductor of time bus 60 to provide delayed time pulses RA, RB, W and C, respectively. RA marks the beginning of the charging of the RAS/ line before a memory operation, RB marks the ending of the RAS/ line charging, C marks the drop of the CAS/ signal to indicate to the memory chips 32 that a column address is being submitted, and W marks the drop of the WE/ signal to indicate to the memory chips 32 that a write operation is to occur. The exact values of the time delays of circuits 61–64 depend on the design requirements of the memory chips which are used.

In one preferred embodiment of the invention, the memory chips 32 are Intel 51C256-15 dynamic random access memory (RAM) devices described in advance information available from Intel Corporation of Santa Clara, Calif. In that embodiment, T1-T4 each have a non-overlapped waveform, each have a rise time of three nanoseconds, a high duration of five nanoseconds, a fall time of three nanoseconds, and a low duration of 54 nanoseconds for a total of 65 nanoseconds. RA has a waveform which has a high for a duration of from 10 nanoseconds after the rise of T1 to 30 nanoseconds after the rise of T1. Similarly, RB is high from 25 nanoseconds to 45 nanoseconds after the rise of T1; C is high from 10 nanoseconds to 50 nanoseconds after the rise of T1; and W is high from five nanoseconds to 50 nanoseconds after the rise of T1. It will be understood that if other memory chips are used, the timing of the various time pulses will vary depending upon the design of the chips used. The RA, RB, C and W timing pulses are also supplied to each of the memory blocks 14 over time bus 60.

A signal REFRESH WINDOW on the refresh window conductor 40 includes a train of pulses having a width which, when ended, leave sufficient time to refresh the memory chips 32 without losing data. As will be explained, the block control circuit 24 includes circuitry to refresh the memory chips 32, to the extent possible, during the REFRESH WINDOW when the memory block 14 is not selected, but if the memory block 14 remains selected during the entire refresh window, the memory chips 32 will be refreshed immediately after the end of the REFRESH WINDOW duration and before data is lost.

Figure 3:
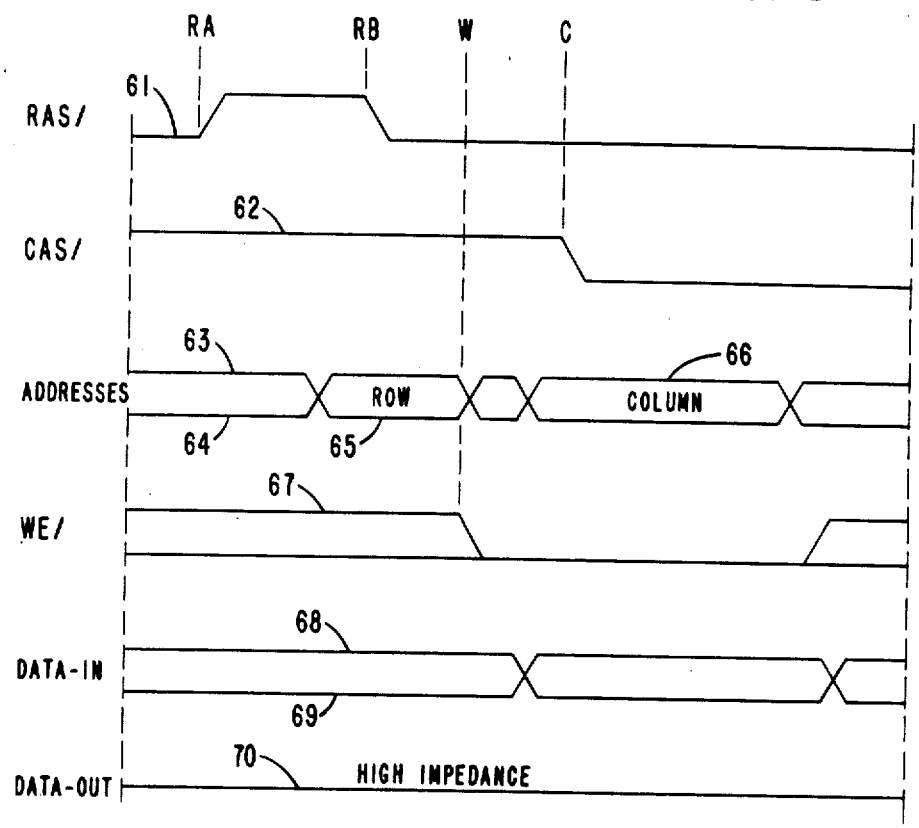
FIG. 3 is a wave form diagram of the various signals of one of the memory chips of the memory block of FIG. 2.

At this point the operation of the memory chips 32 will be reviewed. FIG. 3 is a waveform diagram of the various signals of one of the memory chips 32 for performing a memory write operation. Waveform 61 is the waveform of the RAS/ signal to select a ROW address for the memory chip. In many memory operations it is necessary to precharge the RAS/ line before a memory operation occurs. As shown in FIG. 3, RA designates when the RAS/ signal goes high to start precharging, and RB designates when the RAS/ signal goes low to indicate that the address on the address terminals of the memory chip is a row address. The time between RA and RB is thus the precharge time. It will be noted that after the RAS/ signal goes down at RB, it stays low during the rest of the memory operation.

Waveform 62 is the waveform of the CAS/ signal for selecting a column address for the memory chip. The CAS/ signal goes low at C to indicate to the memory chip that the address on the address terminals of the memory chip is a column address. Waveforms 63 and 64 indicate an envelop for the signals on the address terminals of the memory chip. It will be noted that the row address 65 is placed on the address terminals of the memory chip before the RAS/ signal goes low, and is held for a sufficient time to insure that the row address is properly accepted by the memory chip. The column address 66 is then placed on the address terminals of the memory chip before the drop of the CAS/ signal at C, and is held for a sufficient time to insure that the column address is properly accepted by the memory chip. Waveform 67 is the waveform of the WE/ signal. The WE/ signal goes low at W to indicate to the memory chip that a write operation is to occur. Waveforms 68 and 69 indicate an envelop for the signals on the data-in terminal of the memory chip. Since FIG. 3 illustrates a write operation, the data to be written in the memory chip at the addressed location is placed on the data-in terminal. In this case the data-out signal shown at 70 stays at a high impedance level. If the memory operation is a read, the WE/ signal is held high, and the data stored in the memory chip at the addressed location appears on the data-out terminal.

The preferred memory chips 32 of the memory block 14 of FIG. 2 are capable of two modes of operation, a short cycle mode wherein consecutive operations are confined to the same row, and a long cycle mode wherein consecutive operations occur in different rows. In the preferred Intel 51C256-15 RAM devices, the short cycle mode is referred to by the Intel trademark Ripplemode. In Ripplemode, the RAS/signal is held low, the desired column address is placed on the address terminals of the memory chip, and the CAS/ signal is made low. If the WE/ signal is held high, a read occurs, or if the WE/ signal is made low, at the correct time, a write occurs at the indicated column of the selected row. Another memory operation in the same row may then be made by continuing to hold the RAS/ signal low, and strobing in a new column address with the CAS/ signal.

The block control circuit 24 which generates the various memory control signals to operate the memory operations of the memory chips 32 in an efficient manner, will now be described.

Figure 4:
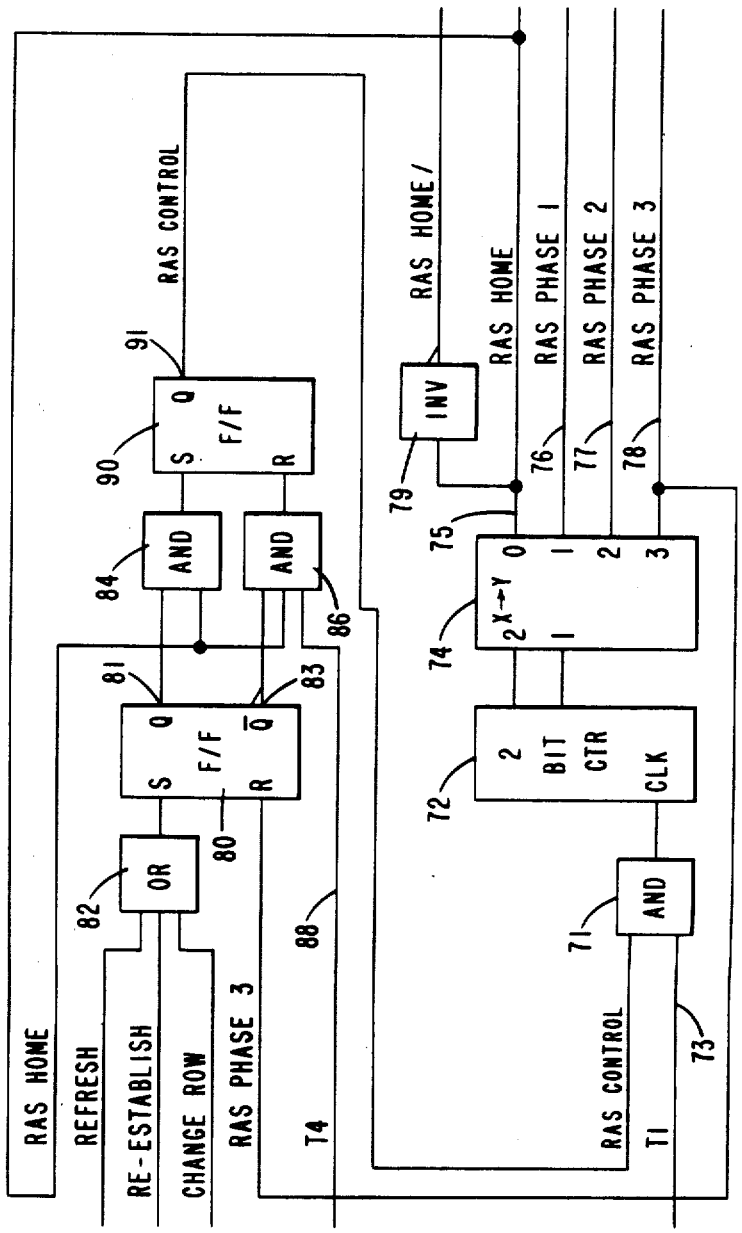
FIG. 4 is a block diagram of a RAS control circuit of a block control circuit of FIG. 2.

FIGS. 4–13 show the various elements of the block control circuit 24 of FIG. 2. FIG. 4 is a block diagram of a RAS control circuit which controls the operation of the block control circuit 24 during many of the memory operations of the associated block memory 14. The output of the RAS control circuit has four cycles, each having its own output signal of RAS PHASE 1, RAS PHASE 2, RAS PHASE 3, and RAS HOME, respectively. RAS PHASE 1, RAS PHASE 2 and RAS PHASE 3 each have a total duration of the T1-T4 timing pulses described in connection with FIG. 2. Referring to FIG. 4, an AND gate 71 has its output connected to the clock input of a two-bit counter 72. One input of AND gate 71 is connected to a RAS CONTROL conductor, to be discussed, and the other input is connected to a T1 conductor 73 which comes from the time bus 60 of FIG. 2. The outputs of the two-bit counter 72 is connected to the inputs of a two-to-four converter 74. The first output 75 of the converter 74 supplies the RAS HOME signal, and the second, third and fourth outputs 76–78 supply the RAS PHASE 1 through RAS PHASE 3 signals, respectively. Inverter 79 inverts the RAS HOME signal to a RAS HOME/ signal. It will be understood that while the RAS CONTROL signal is high, each T1 pulse on 73 will cause the two-bit counter to increment its count. This will in turn cause the outputs 75–78 to sequentially go high, starting first with RAS HOME, and then RAS PHASE 1, and so forth.

RAS PHASE 3 is received by the reset input of a flip/flop 80 whose set input is connected to an OR gate 82. The inputs of the OR gate 82 receive the signals REFRESH, RE-ESTABLISH and CHANGE ROW, to be discussed later. The output 81 of flip/flop 80 is connected to one input of an AND gate 84, and the negation output 83 of flip/flop 80 is connected to one input of an AND gate 86. The other input of AND gate 84 receives the RAS HOME signal from output 75. The AND gate 86 also receives the RAS HOME signal from 75, and the T4 signal on conductor 88 of the time bus 60 of FIG. 2. The output of AND gate 84 is connected to the set input of flip/flop 90, whose output 91 provides the RAS CONTROL signal previously mentioned. The negation output 83 of flip/flop 80 is connected to the reset input of the flip/flop 90 through AND gate 86.

It will thus be understood that when the RAS control circuit of FIG. 4 is in the RAS HOME state, the RAS HOME signal will be high. When any of the REFRESH, RE-ESTABLISH or CHANGE ROW signals go high, flip/flop 90 will be set, causing the RAS CONTROL signal to go high. The next T1 pulse will turn on AND gate 71, thus incrementing the count of the counter 72, and changing the state of the RAS control circuit to RAS PHASE 1. The RAS control circuit will increment through the RAS cycle until the RAS PHASE 3 state is reached. A high RAS PHASE 3 signal will reset flip/flop 80. When the RAS HOME state is reached, a high T4 signal turns on AND gate 86, resetting flip/flop 90 and causing the RAS CONTROL signal to go low. This prevents AND gate 71 from turning on with T1, thereby holding the RAS HOME signal high until the arrival of a high REFRESH, RE-ESTABLISH or CHANGE ROW signal at AND gate 82. It will thus be understood, that the end of the RAS cycle is the RAS HOME state of the RAS control circuit of FIG. 4.

It will be understood that when a read or write operation in a particular memory block 14 is to take place, the BLOCK N SELECT signal for that particular memory block will go high. If the operation is to be a write operation, the SYSTEM WRITE signal on conductor 44 (FIG. 2) will also go high.

The operation of a memory block for writing in a non-selected row will now be described. When any subsystem connected to the memory bus 11 of FIG. 1 is to write data into a memory block 14, the system row address is placed on bus 38, the system column address on bus 36, the signal on the proper BLOCK N SELECT line 20 is raised, and the SYSTEM WRITE signal on line 44 is raised (see FIG. 2). The compare circuit 28 compares the address on bus 38 with the last row address in register 26, and, in this case, finds they are not the same and raises the COMPARE/ signal on conductor 54.

Figure 5:
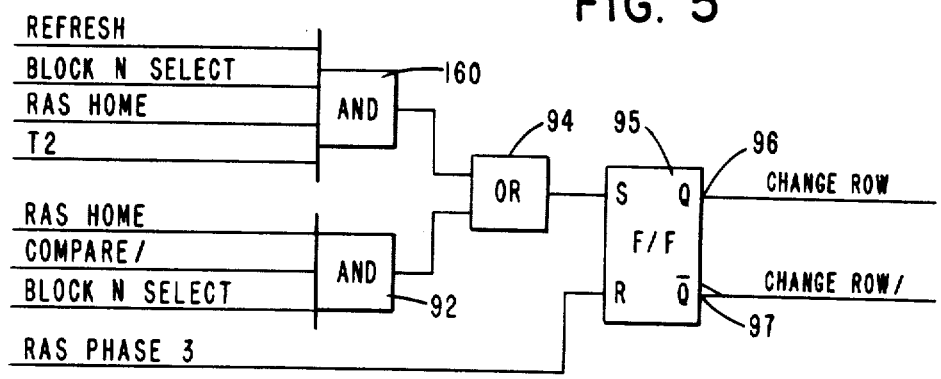
FIG. 5 is a changed row indicating circuit of the block control circuit.

Turning now to FIG. 5, the RAS HOME signal from the RAS control circuit of FIG. 4, the COMPARE/ signal on conductor 54 of FIG. 2, and the BLOCK N SELECT signal on conductor 20 of FIG. 2 are all received by the inputs of an AND gate 92. The output of AND gate 92 is connected to one of the inputs of an OR gate 94, whose output is connected to the set input of a flip/flop 95. The output 96 of flip/flop 95 provides the CHANGE ROW signal, and its negation output 97 provides the CHANGE ROW/ signal. The reset input of flip/flop 95 is connected to the RAS PHASE 3 output 78 of FIG. 4. It can thus be seen that when the RAS control circuit is in its RAS HOME state, the block is selected, and the row address is different than the last row address, then CHANGE ROW will go high and CHANGE ROW/ will go low. The high CHANGE ROW signal will start the RAS cycle as described in connection with FIG. 4.

Figure 6:
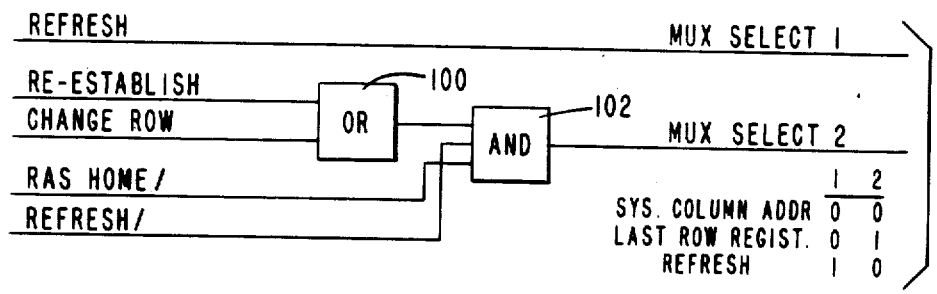
FIG. 6 is a multiplexer control circuit of the block control circuit.

Referring to FIG. 6, the CHANGE ROW signal from output 96 of flip/flop 95 of FIG. 5 is received by the input of an OR gate 100, whose output is connected to one of the inputs of an AND gate 102. The other inputs of the AND gate 102 receive the RAS HOME/ signal from inverter 79 of FIG. 4, and a REFRESH/ signal. The output of AND gate 102 is connected to one conductor of the multiplexer control bus 50, and the other conductor receives a REFRESH signal. In all memory operations except a refresh operation, the REFRESH signal is low, and the REFRESH/ signal is high, as will be explained. Thus, as soon as the RAS cycle goes to RAS PHASE 1, the RAS HOME/ signal will go high, turning on AND gate 102, making the multiplexer control code "01", directing the multiplexer 30 to multiplex addresses from the last row register 26 to the memory chips 32 (see FIG. 2).

Figure 7:
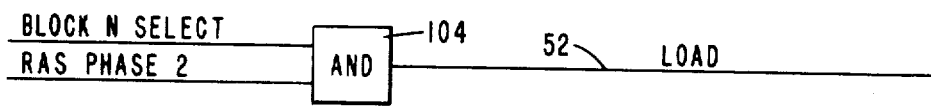
FIG. 7 is a load register circuit of the block control circuit.

Referring now to FIG. 7, BLOCK N SELECT on conductor 20 of FIG. 2, and RAS PHASE 2 on output 77 of FIG. 4 are received by the inputs of an AND gate 104, whose output is connected to control line 52 of FIG. 2, which controls the loading of the last row register 26. Thus when the block has been selected, and the RAS cycle of the circuit of FIG. 4 reaches RAS PHASE 2, the row address on bus 38 is loaded into register 26. It will be remembered that the multiplexer control bus 50 carries a code of "01" (refer to FIG. 6) which multiplexes the address loaded into register 26 to the address terminals of the memory chips 32 of FIG. 2. It will thus be understood that at T1 of RAS PHASE 2, the system row address will be presented to the memory chips.

Figure 8:
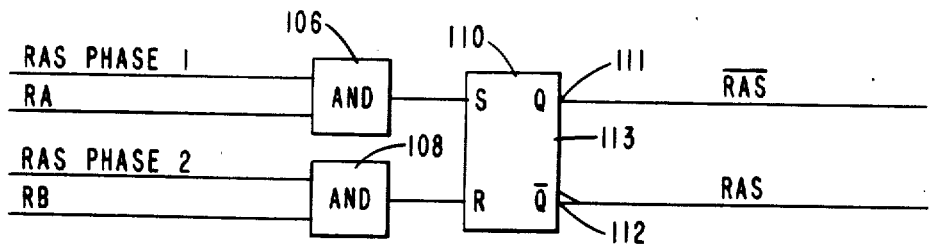
FIG. 8 is a RAS/ signal control circuit of the block control circuit.

Referring to FIG. 8, RAS PHASE 1 of output 76 of FIG. 4 and RA of delay circuit 61 of FIG. 2 are received by the inputs of an AND gate 106. RAS PHASE 2 of output 77 of FIG. 4 and RB of delay circuit 62 of FIG. 2 are received by the inputs of an AND gate 108. The output of AND gate 106 is connected to the set input of a flip/flop 110, and the output of AND gate 108 is connected to its reset input. The output 111, of flip/flop 110, provides the RAS/ signal of the control signals transmitted over control bus 58 of FIG. 2, and the negation output 112 of the flip/flop 110 provides an RAS signal. It will be understood that at RA during the RAS PHASE 1 state of the RAS cycle, AND gate 106 will be turned on, causing the RAS/ signal to go high (see RA of FIG. 3), while at RB, during RAS PHASE 2 state of the RAS cycle, AND gate 108 will be turned on, causing the RAS/ signal to go low (see RB of FIG. 3). It will be remembered that at the beginning (T1) of RAS PHASE 2, the system row address in the last row register will be presented to the address terminals of the memory chips. After a specified delay after T1 of RAS PHASE 2, as determined by delay circuit 62 of FIG. 2, the RAS/ signal will go low, strobing the new row address into the memory chips of the selected block.

Returning to FIG. 5, when RAS PHASE 3 of the RAS cycle of the circuit of FIG. 4 is reached, flip/flop 95 will be reset, causing CHANGE ROW to go low and CHANGE ROW/ to go high. Referring to FIG. 6, CHANGE ROW/ going high will turn off OR gate 100, which in turn will turn off AND gate 102, and change the multiplexer control code to "00". This will cause the multiplexer 30 of FIG. 2 to multiplex the system column address on bus 36 to the address terminals of the memory chips 32.

Figure 9:
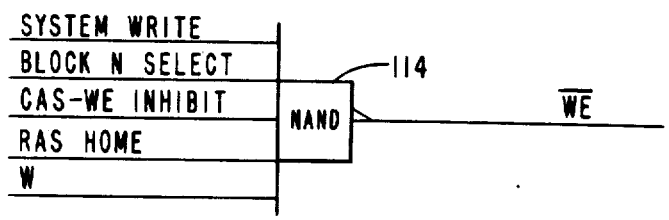
FIG. 9 is a WE/ signal control circuit of the block control circuit.

Referring to FIG. 9, the SYSTEM WRITE signal on conductor 44 of FIG. 2, the BLOCK N SELECT signal on conductor 20 of FIG. 2, a CAS-WE INHIBIT signal to be explained later, the RAS HOME signal of output 75 of FIG. 4, and the W signal from time delay circuit 64 of FIG. 2 are all received by a respective input of a NAND gate 114. The output of NAND gate 114 provides the WE/ signal transmitted by control bus 58 of FIG. 2. As will be explained, the CAS-WE INHIBIT signal will be high in this operation. It will then be understood that at W during the RAS HOME state, which has been explained as being the last cycle of a RAS cycle, when the block is selected and a write is to occur, the WE/ signal will go low (see W of FIG. 3).

Figure 10:
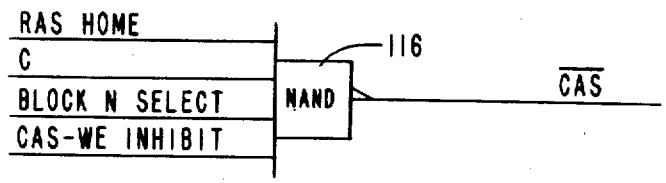
FIG. 10 is a CAS/ signal control circuit of the block control circuit.

Referring to FIG. 10, the RAS HOME signal of output 75 of FIG. 4, the C signal of time delay circuit 63 of FIG. 2, the BLOCK N SELECT signal on conductor 20 of FIG. 2, and the CAS-WE INHIBIT signal are all received by a respective input of a NAND gate 116. The output of NAND gate 116 provides the CAS/ signal transmitted by control bus 58 of FIG. 2. Thus, at time C after T1 of the RAS HOME state when the block is selected, the CAS/ signal will go low (see C of FIG. 3), strobing in the column address as previously described.

Figure 11:
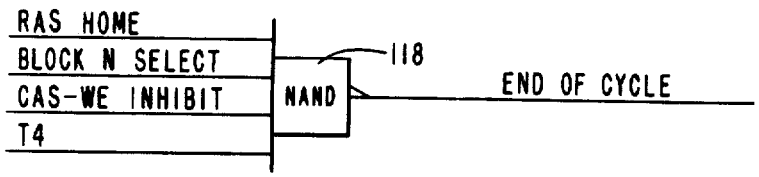
FIG. 11 is a END OF CYCLE signal control circuit of the block control circuit.

Referring now to FIG. 11, the RAS HOME signal of output 75 of FIG. 4, the BLOCK N SELECT signal on conductor 20 of FIG. 2, the CAS-WE INHIBIT signal, and the T4 signal from clock 22 of FIG. 2 are all received by a respective input of an AND gate 118. The output of AND gate 118 provides the END OF CYCLE signal which is transmitted over conductor 46 from the block control circuit 24 of FIG. 2 to the memory subsystem controller 10 of FIG. 1. Thus at T4 of the RAS HOME state of the RAS cycle, the AND gate 118 of this selected memory block 14 will send an END OF CYCLE signal to the memory subsystem controller 10 to indicate that the requested memory operation is complete.

Returning to FIG. 4, the RAS PHASE 3 state of the RAS cycle previously described will reset flip/flop 80. At the next T1 on conductor 73, the RAS HOME signal will go high as previously described. When T4 of RAS HOME goes high, all of the inputs of AND gate 86 will be high, causing the flip/flop 90 to be reset, changing the RAS CONTROL signal to a low. This low will inhibit AND gate 71, locking the RAS control circuit of FIG. 4 in the RAS HOME state until the next REFRESH, RE-ESTABLISH, or CHANGE ROW high signal on OR gate 82.

When a read from a non-selected row is ordered, the signals to the selected memory block will be the same as those described in connection with the write request, except that the SYSTEM WRITE signal will remain low. As can be seen in FIG. 9, this will hold NAND gate 114 off, thereby keeping the WE/ signal high indicating that a read operation is to take place. The other operations will be as described until the read cycle is complete.

A read or write from a selected row will now be described. The same signals and addresses will be supplied to the selected memory block as previously described, however, the row address on bus 38 of FIG. 2 will be the same as the address in the last row register. In this case, the compare circuit 28 will determine that the two addresses are the same, and the COMPARE/ signal on conductor 54 will be low. Looking to FIG. 5, it will be understood that AND gate 92 will thus be held off, leaving the CHANGE ROW signal low, since flip/flop 95 was reset by the previous RAS PHASE 3 state.

Since the CHANGE ROW signal remains low, the RAS control circuit of FIG. 4 will stay in the RAS HOME state because OR gate 82 will remain off. Also the RAS HOME/ signal from inverter 79 will be low, which will hold AND gate 102 of FIG. 6 off. Thus the code on the multiplexer control bus 50 will remain "00", thereby multiplexing the system column address on bus 36 of FIG. 2, to the address terminals of the memory chips 32. Since the RAS cycle was not started, the RAS/ signal of FIG. 8 will remain low, thereby indicating that a same row operation is to take place. Returning to FIG. 10, it will be understood that the CAS/ signal will go low at time C, as previously described, to strobe in the column address.

If the memory operation is a write, the WE/ signal of FIG. 9 will go low at time W to indicate a write operation is to take place. As described in connection with FIG. 11, an END OF CYCLE signal will be transmitted at T4.

Refresh of the memory chips 32 will now be discussed. Since the preferred memory chips 32 are RAM devices whose memory is volatile, the memory chips 32 must be periodically refreshed, otherwise stored data will be lost. In the case of Intel 51C256-15 devices, a refresh cycle is required every 7.8 microseconds. In this case, the REFRESH WINDOW signal includes high pulses having a duration of 7.0 microseconds, and the REFRESH START signal includes high pulses which start at the beginning of every REFRESH WINDOW signal pulse.

Before the refresh circuitry is discussed, the operation of the preferred memory chips should be understood. In a memory operation, the RAS/ signal cycle is the same as present in a normal read or write operation. However, when there is no CAS/ operation during the active RAS cycle, a refresh-only operation occurs to all the bits in the row selected by the row addresses.

At the end of the refresh cycle, the refresh row address remains loaded in the memory chips. Thus, if the row address that the memory chip needs for the next memory operation is different than the refresh row address, this next operation row address must be loaded into the memory chips. It will be understood that if a complete refresh operation occurs, then eight memory cycles are required, four for the refresh operation and four for loading the next operation row address into the memory chips, referred to herein as the RE-ESTABLISH operation.

Figure 12:
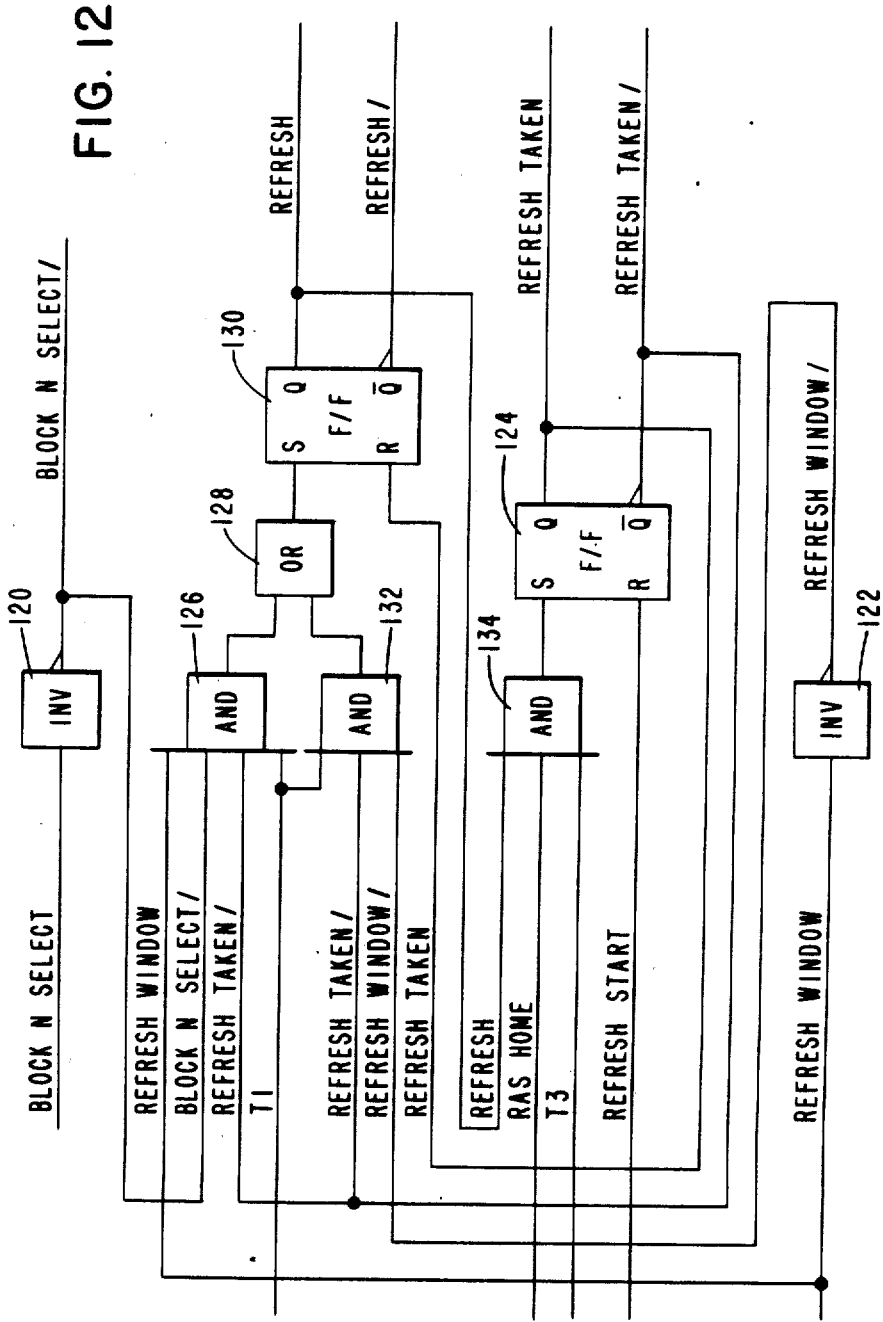
FIG. 12 is a refresh control circuit of the block control circuit.

FIG. 12 is a block diagram for a refresh control circuit which is present in the block control circuit 24 of FIG. 2. An inverter 120 receives the BLOCK N SELECT signal on conductor 20 of FIG. 2 and inverts it to a BLOCK N SELECT/ signal. An inverter 122 receives the REFRESH WINDOW signal on conductor 40 of FIG. 2, and inverts it to a REFRESH WINDOW/ signal.

A refresh cycle can be initiated in two ways. The first way occurs if the memory block is not selected for a memory operation during the refresh window. The second way occurs if the memory block is selected for memory operation during the entire duration of the refresh window, and the refresh window times out without a refresh having been taken.

A flip/flop 124 keeps track of whether a refresh has been taken during the current refresh window. The REFRESH START signal resets flip-flop 124, causing the REFRESH TAKEN signal to be low, and the REFRESH TAKEN/ signal to be high.

An AND gate 126 causes a refresh cycle when the associated memory block 14 of FIG. 2 is not selected during the refresh window. The inputs to AND gate 126 include the REFRESH WINDOW signal on conductor 40 of FIG. 2, the BLOCK N SELECT/ signal from inverter 120, the REFRESH TAKEN/ signal from flip/flop 124 and the T1 signal from the clock 22 of FIG. 2. Thus if the block is not selected at any T1 during the refresh window, and a refresh has not been earlier taken during that window, the AND gate 126 turns on. The output of AND gate 126 is connected to the input of an OR gate 128, whose output is connected to the set terminal of a flip/flop 130. Thus, setting the flip/flop 130 causes the REFRESH signal to go high and the REFRESH/ signal to go low.

An AND gate 132 causes a refresh cycle when the associated memory block 14 of FIG. 2 has not been earlier refreshed during the refresh window and the refresh window ends. The inputs of AND gate 132 include the T1 signal from the clock 22 of FIG. 2, the REFRESH TAKEN/ signal from the flip/flop 124, and the REFRESH WINDOW/ signal from the inverter 122. Thus, if at the first T1 after the refresh window has ended and a refresh cycle has not been taken during this refresh window, the flip/flop 130 will be set by AND gate 132 through OR gate 128, causing the REFRESH signal to go high and the REFRESH/ signal to go low.

An AND gate 134 is provided which receives on its inputs, the REFRESH signal of flip/flop 130, the RAS HOME signal on output 75 of FIG. 4, and the T3 signal of the clock 22 of FIG. 2. The output of AND gate 134 is connected to the set terminal of flip/flop 124 to return the REFRESH TAKEN and REFRESH TAKEN/ signals to their original conditions at the very end of the refresh cycle when the RAS control circuit of FIG. 4 reaches the RAS HOME state.

Returning to FIG. 4, it can be seen that the high REFRESH signal inputted to OR gate 82 will start a RAS cycle of the RAS control circuit of FIG. 4. In FIG. 6, it can be seen that the REFRESH signal high will be placed on the first conductor of the multiplexer control bus 50, and the REFRESH/ signal low will hold off the AND gate 102 such that a low will be placed on the second conductor such that the code on the multiplexer control bus 50 will be "10". This will control the multiplexer 30 of FIG. 2 to multiplex the REFRESH ROW ADDRESS signals on bus 34 to the address terminals of memory chips 32. The refresh row address may be supplied by a refresh row counter in the memory subsystem controller 10, along with the refresh window and refresh start signals from a refresh clock, as are well understood in the art. Thus the refresh row address will be strobed into the memory chips 32 by the operation of the RAS/ signal from the circuit of FIG. 8, as previously explained.

FIG. 13 is a block diagram for a CAS-WE inhibit circuit located in the block control circuit 24 of FIG. 2. It will be remembered that when the CAS-WE INHIBIT signal is positive, the WE/, CAS/, and END OF CYCLE signals will be generated for read and write operations, as previously explained. However, the WE/ and CAS/ signals are to be held in their high states for a refresh operation of the preferred memory chips 32 of FIG. 2.

In FIG. 13, an OR gate 138 has an input for receiving the REFRESH signal from flip/flop 130 of FIG. 12. The output of OR gate 138 is connected to an input of an AND gate 140, whose other input receives the RAS PHASE 1 signal from output 76 of FIG. 4. The output of AND gate 140 is connected to the set terminal of a flip/flop 142. The negation output 143 of flip/flop 142 provides the CAS-WE INHIBIT signal. Thus, when the REFRESH signal goes high, and the RAS control circuit of FIG. 4 reaches its RAS PHASE 1 state, the flip/flop 142 is set, causing the CAS-WE INHIBIT signal to go low. This inhibits NAND gates 114 and 116 of FIGS. 9 and 10 respectively, such that the WE and CAS/ signals remain high. In this way the memory chips 32 of FIG. 2 enter their refresh operation. The CAS-WE INHIBIT signal also inhibits the NAND gate 118 of FIG. 11 such that an END OF CYCLE signal high is not generated at the end of the refresh cycle.

Returning to FIG. 13, it will be seen that the CAS-WE INHIBIT signal is received by the input of an AND gate 146 along with the T3 signal from the clock 22 of FIG. 2. The output of AND gate 146 is connected to the reset terminal of a flip/flop 148 whose output 149 is connected to the input of an AND gate 150 along with the T1 signal of clock 22. The output of AND gate 150 is connected to one input of an OR gate 152, whose output is connected to the reset terminal of flip/flop 142. The output 144 of flip/flop 142 is connected to an input of an AND gate 154. The AND gate 154 also receives the RAS HOME signal from output 75 of FIG. 4, and the T3 signal from clock 22 of FIG. 2.

It will thus be understood that when the REFRESH or the RE-ESTABLISH (to be discussed later) signals go high, the CAS-WE INHIBIT signal will go low, and the output 144 will go high. At T3 of RAS HOME at the end of that RAS cycle, the flip/flop 148 will be set, making output 149 high. Then, at the next T1, the AND gate 150 will turn on, which will reset flip/flop 142 through OR gate 152, resetting the CAS-WE INHIBIT signal high, thereby enabling the WE/, CAS/, and END OF CYCLE gates to be operated, as previously discussed. Now that the memory chips 32 of FIG. 2 have been refreshed, the row address must be re-established. The exact procedure followed to re-establish the memory chips depends on whether the memory block is selected during the RE-ESTABLISH cycle and is to be explained.

Figure 14:
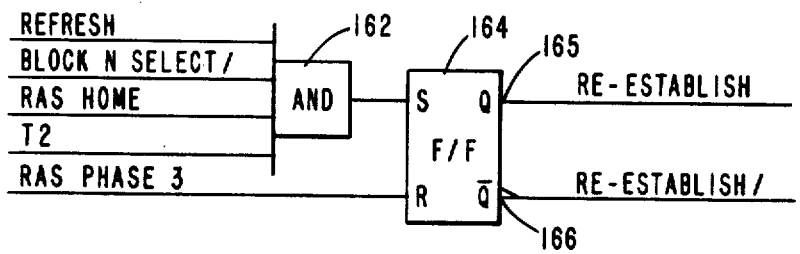
FIG. 14 is a re-establish circuit of the block control circuit.

FIG. 14 is a block diagram of a circuit included in the block control circuit 24 of FIG. 2. It includes an AND gate 162 having an input for receiving the REFRESH signal from flip/flop 130 of FIG. 12, the BLOCK N SELECT/ signal from the inverter 120 of FIG. 12, the RAS HOME signal of the output 75 of FIG. 4, and the T2 signal from the clock 22 of FIG. 2. The output of AND gate 162 is connected to the set terminal of a flip/flop 164. The reset terminal of flip/flop 164 receives the RAS PHASE 3 signal of the output 78 of FIG. 4. The output 165 of flip/flop 164 provides a RE-ESTABLISH signal, and its negative output 166 provides a RE-ESTABLISH/ signal. The clock signal T2 of the RAS HOME state of the circuit of FIG. 4 occurs near the end of the refresh operation previously discussed. At that time, if the BLOCK N SELECT/ signal is true because the block is not selected, then the RE-ESTABLISH signal of FIG. 14 goes high, and a RE-ESTABLISH operation is started.

Returning to FIG. 5, an AND gate 160 receives the REFRESH signal from flip/flop 130 of FIG. 12, the BLOCK N SELECT signal from conductor 20 of FIG. 2, the RAS HOME signal from the output 75 of FIG. 4, and the T2 signal from the clock 22 of FIG. 2. Thus, if the block is selected, making the BLOCK N SELECT signal true, AND gate 160 will turn on, setting the flip/flop 95 through OR gate 94, and making the CHANGE ROW signal high. This will start a CHANGE ROW operation as previously described.

The only difference between a complete RE-ESTABLISH operation and a CHANGE ROW operation is that the RE-ESTABLISH operation causes the CAS-WE INHIBIT signal to go low, as the RE-ESTABLISH signal is received by one of the inputs of the OR gate 138 of FIG. 13. Thus it will be understood that if the block is not selected throughout the RE-ESTABLISH cycle, the CAS-WE INHIBIT signal will remain low, thus inhibiting the WE/, CAS/ and END of cycle signals.

As can be seen in FIG. 4, the RE-ESTABLISH signal of FIG. 14 is received by the OR gate 82 to start the RAS control circuit of FIG. 4 to start another RAS cycle. If the block is not selected throughout the RE-ESTABLISH operation, the contents of the last row register 26 of FIG. 2 will be multiplexed by the circuit of FIG. 6 and the multiplexer 30 to the memory chips 32, and strobed into the memory chips 32 as the row address by the RAS/ signal generated by the circuit of FIG. 8. Since it is possible for the block to be selected during the RE-ESTABLISH operation, the present circuit will convert the RE-ESTABLISH operation to an appropriate operation, if the requested operation can be serviced.

If the block is selected at or before the RAS PHASE 2 state of the RAS control circuit of FIG. 4, then at RAS PHASE 2, the address on the system row address bus 38 will be loaded into the last row register 26 of FIG. 2 by the operation of the circuit of FIG. 7. Then, as previously explained, the address in the last row register 26 will be multiplexed by multiplexer 30 of FIG. 2 and the circuit of FIG. 6, and strobed into the memory chips 32 by the RAS/ signal of FIG. 8. Since the address on the system row address bus 38 and the address in the last row register 26 of FIG. 2 are the same, the COMPARE signal of FIG. 13 will be high. The BLOCK N SELECT signal will then turn on AND gate 170, resetting flip/flop 142 of FIG. 13 through OR gate 152, causing the CAS-WE INHIBIT signal to go high. The WE/ signal of FIG. 9, the CAS/- signal of FIG. 10 and the END OF CYCLE signal of FIG. 11 will then be generated, as appropriate, to complete the requested memory operation.

If the block is selected after the RAS PHASE 2 state, but before the RAS HOME state of the RAS control circuit of FIG. 4, then the requested memory operation can be completed only if the address in the last row register 26 is the same as the address on the system row address bus 38 of FIG. 2, since the last row register 26 was loaded by the circuit of FIG. 7 by the RAS PHASE 2 signal. If these addresses are the same, the COMPARE signal from the inverter 172 of FIG. 13 will be high, turning on AND gate 170 to go high, as explained in the preceding example. Thus, as in that case, the RAS/, WE/, CAS/ and END OF CYCLE signals will be generated, as appropriate, to complete the requested memory operation.

It will thus be seen that a computer system memory control apparatus has been described which controls the memory in an efficient manner during memory and refresh operations. It will be understood by those skilled in the art that the disclosed embodiment is exemplary only, and that various elements disclosed may be replaced by equivalents without departing from the invention hereof, which equivalents are intended to be covered by the appended claims.

What is claimed is:

1. A computer memory subsystem comprising:
    a memory subsystem controller having means for providing a plurality of block select signals;
    row address means in said memory subsystem controller for providing a row address;
    a plurality of memory blocks, one for each of the block select signals provided by said memory subsystem controller;
    an input in each of said memory blocks connected to said memory subsystem controller for receiving one of said block select signals;
    random access memory (RAM) devices in each of said memory blocks for storing data;
    a refresh means in each of said memory blocks connected between said input and said RAM devices of its memory block for refreshing its connected RAM devices independent of the refreshing of the RAM devices of other blocks, the refreshing of said refresh means to occur when the associated memory block is not selected by its corresponding block select signal from said memory subsystem controller;
    last row means in each of said memory blocks connected to said row address means for storing the last row address received from said memory subsystem controller before refreshing by said refresh means; and
    re-establish means in each of said memory blocks connected between said last row means and said RAM devices for re-establishing said last row address in its associated RAM devices after said associated RAM devices are refreshed.

2. The computer memory subsystem of claim 1 further comprising refresh window signal generating means for providing a refresh window signal to each of said memory blocks; and wherein each of said memory blocks further includes a window circuit means connected to said refresh window signal generating means and said refresh means for refreshing the associated RAM devices in its memory block at the end of said refresh window signal if said associated RAM devices have not been otherwise refreshed.

3. The computer memory subsystem of claim 2 further comprising clock means for generating timing signals; and wherein each of said memory blocks further includes conversion means connected to said memory subsystem controller, said clock means and said re-establish means for converting the re-establishing of said re-establish means to a memory operation if said associated memory block is selected by the corresponding block select signal from said memory subsystem controller within a set time of the re-establishing of said re-establish means as timed by said timing signals.

4. The computer memory subsystem of claim 3 wherein each of said conversion means includes comparing means connected to said row address means and said last row means for comparing the row address presently provided by said memory subsystem controller with the last row address stored in said last row means and for converting the re-establishing of said re-establish means to a memory operation only if said compared row addresses are the same.

5. The computer memory subsystem of claim 1 wherein each memory block includes:
    a last row register in said last row means connected to said row address means of said memory subsystem controller;
    comparison means connected to said last row register and said row address means of said memory subsystem controller for comparing the contents of said last row register and the row address provided by said row address means, said comparison means having a first state when its comparison is the same and a second state when its comparison is not the same; and
    same row means connected to said comparison means for placing said RAM devices of the associated block in a same row operating mode when said comparison means is in its first state such that memory operations of said RAM devices are in the same row.

6. A computer memory apparatus comprising:
    random access memory (RAM) chips, each chip having a same row operating mode wherein sequential memory operations remain in the same row, and each chip further having data means for receiving and sending data to be written into and read from said RAM chips by the data processing system, address terminals for receiving addresses for writing and reading of the data, and row address strobe (RAS/), column address strobe (CAS/) and write enable (WE/) signal inputs for controlling the operation of said RAM chips;
    system row address receiving means for receiving a system row address from the data processing system;

system column address receiving means for receiving a system column address from said data processing system;

a last row register having an input, an output, and a load control line, said input connected to said system row address receiving means for receiving therefrom system row addresses;

comparison means connected to the output of said last row register and to said system row address receiving means, said comparison means for comparing the address in said last row register and the address of said system row address receiving means, and for providing a comparison signal which has a first state if the comparison is true, and a second state if the comparison is not true;

multiplexer means having a first input connected to said system column address receiving means, a second input connected to the output of said last row register, an output connected to the address terminals of said RAM chips, and a control means for receiving multiplexer control signals which control said multiplexer means such that the address appearing on one of the inputs of said multiplexer is multiplexed to the address terminals of said RAM chips dependent upon the multiplexer control signals received on the control means of said multiplexer;

block select signal receiving means for receiving a block select signal when the RAM chips are selected by said data processing system for memory operations; and block control means having a first input connected to said block select receiving means, a second input for receiving the comparison signal of said comparison means, a load control output connected to the load control line of said last row register, a multiplexer control output connected to the control means of said multiplexer, and RAS/, CAS/, and WE/ signal outputs connected to the corresponding RAS/, CAS/ and WE/ signal inputs, respectively, of said RAM chips;

said block control means including means for placing control signals on its output controlling said multiplexer means to multiplex said system column address to the address terminals of said RAM chips and for maintaining the RAS/ signal on its RAS/ signal output in its active state when both the block select signal on the first input of said block control means is active, and the comparison signal on the second input of said block control means is in its first state, thereby placing said RAM chips in their same row operating mode.

7. The apparatus of claim 6 further comprising:
refresh row receiving means for receiving a refresh row address;
refresh window signal receiving means for receiving a refresh window signal during which a refresh of said RAM chips is to occur;
said multiplexer means includes a third input connected to said refresh row receiving means, and said block control means includes means for generating multiplexer control signals which control the multiplexer such that the refresh row address is multiplexed to the address terminals of said RAM chips during a refresh operation;
said block control means further including refresh means connected to said refresh window signal receiving means, said refresh means for refreshing said RAM chips either;
during the refresh window when said RAM chips are not selected by the data processing system, or
immediately after the refresh window when said RAM chips are selected throughout the refresh window by the data processing system.

8. The apparatus of claim 7 wherein said block control means further includes;
re-establish means for re-establishing the address stored in said last row address register into said RAM chips after said RAM chips have been refreshed.

9. The apparatus of claim 8 wherein said block control means further includes;
converting means for converting the re-establishing of said re-establish means into a memory operation when said RAM chips are selected by said data processing system either while said RAM chips are being refreshed or before a set time in the re-establishing of said re-establish means.

10. The apparatus of claim 9 wherein said block control means further include:
means for loading at the set time, the address received by said system row address receiving means in said last row register when said RAM chips are selected during the re-establishing of said RAM chips by said re-establish means.

11. The apparatus of claim 10 wherein said converting means further includes:
means for converting the re-establishing of said re-establish means into a memory operation when said RAM chips are selected by said data processing system after the set time if, when selected, the contents of said last row register is the same as the address of said system row address receiving means.

* * * * *